United States Patent [19]

Sugiura

[11] Patent Number: 4,608,710

[45] Date of Patent: Aug. 26, 1986

[54] APPARATUS FOR RECEIVING SATELLITE BROADCASTS

[75] Inventor: Toshihiro Sugiura, Aichi, Japan

[73] Assignee: Masprodenkoh Kabushikikaisha, Japan

[21] Appl. No.: 729,900

[22] Filed: May 3, 1985

Related U.S. Application Data

[63] Continuation of Ser. No. 509,101, Jun. 29, 1983, abandoned.

[30] Foreign Application Priority Data

Jul. 15, 1982 [JP] Japan ................... 57-123491

[51] Int. Cl.$^4$ ............................ H04B 1/26; H04H 1/02
[52] U.S. Cl. ......................................... 455/4; 455/5; 455/151; 455/183; 455/316
[58] Field of Search ...................... 455/3–6, 455/12, 183, 189, 190, 151, 314–316, 323; 358/86, 191.1

[56] References Cited

U.S. PATENT DOCUMENTS

4,417,279 11/1983 Shinkawa et al. ................. 455/316
4,454,538 6/1984 Toriumi .................... 455/5

FOREIGN PATENT DOCUMENTS

63105 5/1980 Japan .................... 455/323

OTHER PUBLICATIONS

"Low-Noise 12 GHZ Front End Designs for Direct Satellite Television Reception", by Harrop et al, Philips Tech. Review, vol. 39, 1980, No. 10.

"Integration Simplifies TVRO Design", by Fornaciari, Microwave System News (USA), vol. 11, No. 3, 3/1981.

"Direct Broadcast from Low Power Satellites", by Grant, Conf: 1981, International Conf. on Communications, 6/1981.

"How to Build a Satellite TV Receiver", Radio Electronics, 8/1981.

*Primary Examiner*—Jin F. Ng
*Attorney, Agent, or Firm*—William A. Drucker

[57] ABSTRACT

An apparatus for receiving satellite broadcasts comprises a frequency converter for outdoor use to which a receiving antenna is to be connected and a station selector for indoor use to which a television receiver is to be connected, the converter and the selector being connected to each other by a transmission line. The selector supplies the converter with a station-selection signal corresponding to a channel as chosen by the user, through the transmission line. Upon reception of the selection signal, the converter picks up the channel signal corresponding to the selection signal from a number of different broadcast microwave signals intercepted by the antenna, and sends the selected signal to the selector through the line. The signal is then received by the television receiver.

5 Claims, 10 Drawing Figures

APPARATUS FOR RECEIVING SATELLITE BROADCASTS

This application is a continuation, of application Ser. No. 509,101, filed June 29, 1983 now abandoned.

BACKGROUND OF THE INVENTION

1. Field of the Invention

This invention relates to apparatus for receiving broadcast microwave signals from broadcasting satellites.

2. Description of the Prior Art

The microwave signals of television programs received in broadcasting satellites from a number of ground stations may be intercepted by an antenna located outdoors, introduced indoors through a single transmission line, and then subjected to the selection of a desired channel signal from among them for supply to a television receiver. Apparatus for such a reception are a convenient device since it enables a desired channel to be selected inside a house or building. As well known in the art, however, the higher the frequency of the signal passing the transmission line, the more energy the signal loses through the line. Therefore, when the different channel signals have reached indoors, they may be different from one another in their energy levels with the result that the channels of higher frequencies have their energy levels lowered to smaller degrees as well as that all incoming signals of different channels generally have their energies reduced in appreciable degrees, because of their extremely high frequencies. Accordingly, many conventional apparatus for such a reception require the use of an equalizer to make uniform the levels of the different channel signals as well as the use of a wide-band amplifier to increase the lowered levels of all channel signals.

SUMMARY OF THE INVENTION

It is an object of the invention to provide an apparatus for making an indoor selection of a desired signal from among different channel signals picked up by an outdoor receiving antenna and receiving the signal by an indoor television receiver.

Another object of the invention is to provide a receiving apparatus of the character described above which enables a desired one of different channel signals picked up by an outdoor antenna to be selected in an outdoor converter device by making an actual manual operation of selection inside a house or building and enables only the selected signal to be introduced indoors through a transmission line. When such an object is achieved, there is no longer any need to provide the equalizer or wideband amplifier as required by the prior art, thereby enabling a signal transmission line to be of a simpler circuit construction.

Still another object of the invention is to provide a receiving apparatus of the character described above which enables a desired channel signal to be selected under a reduced frequency and introduced indoors through a transmission line while minimizing its energy loss. When this object is achieved, a sufficiently high level signal can be received by a television receiver so that the receiver provides a satisfactorily detailed picture of better quality.

Still further object of the invention is to provide a receiving apparatus of the character described above which makes it possible to keep selecting the signal of a desired channel in an outdoor converter device without allowing the signal to create any unstable condition if the outdoor temperature undergoes considerable or sudden changes during the reception of the particular desired signal. When this object is achieved, it is possible to keep receiving the desired channel under stable condition by a television receiver.

According to the invention, a number of different channel signals intercepted by an outdoor receiving antenna are mixed with freqeuncy-conversion signals produced by an oscillator provided in the outdoor converter device so that a desired signal may be picked up from among the different channel signals. This feature of the invention enables the preceding second and third objects thereof to be achieved.

Also, according to the invention, fundamental signals for assisting in the selection of a desired channel signal are supplied from an indoor channel or station selector to the outdoor converter device through the transmission line. It is an additional teaching of the invention in that the fundamental or selection signals thus supplied are stable since they are emitted from the place whose temperature is not subject to considerable variation, namely, the station selector located inside a house or building.

These stable selection signals supplied to the outdoor converter device are used as reference selector signals with which to compare the frequency-conversion signals from the oscillator and adjust the conversion signals so that they have the predetermined exact frequencies corresponding to those of the selection signals before they are mixed with the various channel signals from the receiving antenna. By this control of the frequencies of the conversion signals, these signals are allowed to pick up the desired one of the different channel signals from the antenna.

On the other hand, in case no proper control such as mentioned above is made of the frequency-conversion signals, then it may be difficult for the conversion signals to pick up the desired channel signal if the frequencies of the conversion signals have fluctuated in a significant degree due to a considerable variation in the temperature of the outdoor converter device. However, according to the invention, the above-mentioned feature ensures the accurate selection of the desired channel signal irrespeçtive of variations in the outdoor temperature.

Other objects and advantages of the invention will become apparent during the following discussion of the accompanying drawings.

DESCRIPTION OF THE PREFERRED EMBODIMENTS

Figure 1:
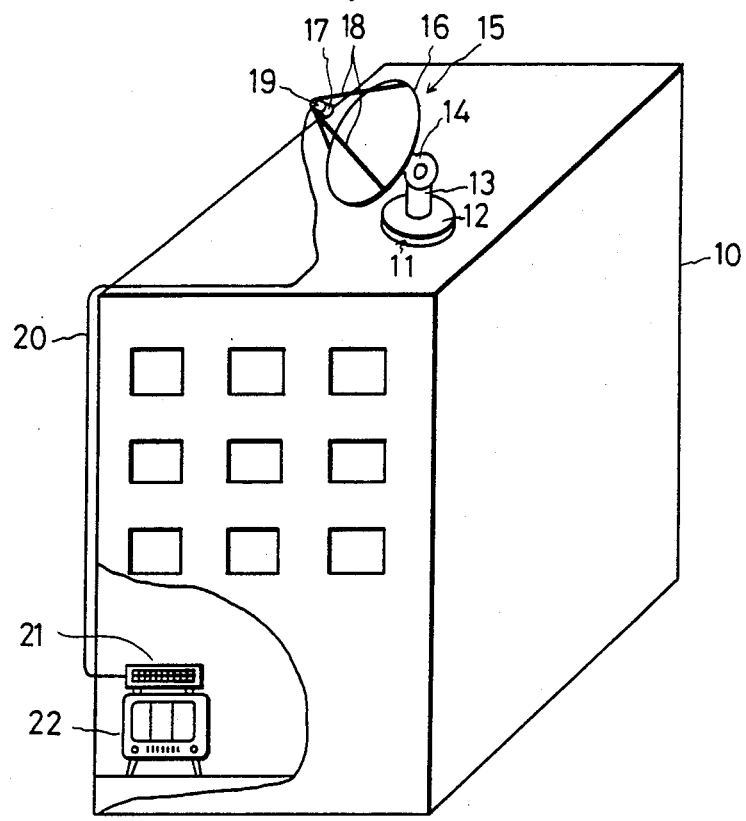
FIG. 1 illustrates a receiving apparatus according to the invention which is arranged for the reception of satellite broadcasts in a building.

Referring now to the drawings, and to FIG. 1 in particular, a parabolic antenna 15 is located on the rooftop of a building 10 as a receiving antenna. This antenna 15 is secured to a support means 11 which includes a base 12 securely fastened onto the rooftop, a post 13 rotatably mounted on the base 12, and a support arm 14 pivotably connected to the top of the post 13. The antenna 15 is connected to one end of the support arm 14. As is well known in the art, the antenna 15 includes a parabolic mirror 16 for reflecting microwaves and a horn 17 located in the position on which the reflected waves focus. The horn 17 is fastened to a case 19 of a converter (as hereinafter described) which is supported by rods 18 projecting from the circumference of the reflector 16. A transmission line 20, such as a coaxial cable, is connected to the converter at its one end, and also connected to a station selector 21 at its other end, which selector 21 is located inside the building 10 and connected to a television receiver 22.

Figure 2:
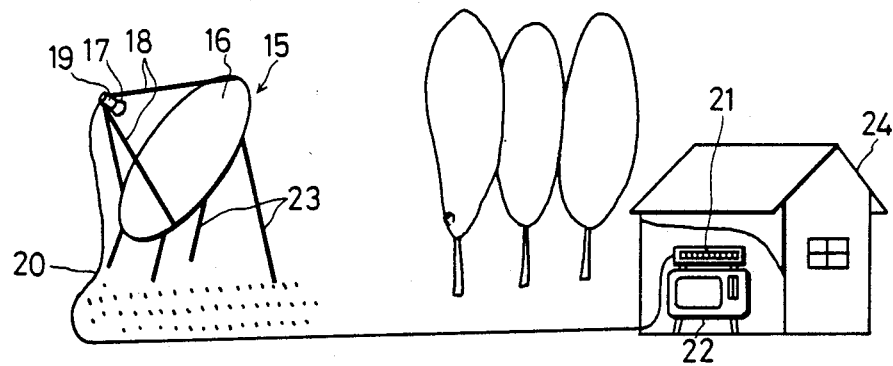
FIG. 2 shows the apparatus of FIG. 1 which is arranged for the reception in a usual house.

Referring to FIG. 2, the parabolic antenna 15 may be located on the ground, instead of on the top of the building, by means of supports 23. Also in this case, the station selector 21 may be placed inside a usual house 24, the transmission line 20 from the antenna 15 being connected thereto.

Figure 3:
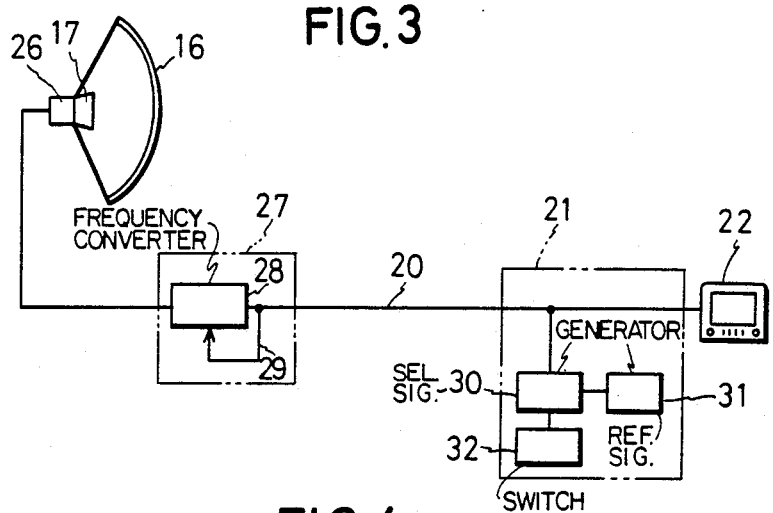
FIG. 3 is an outline of a receiving apparatus that is one embodiment of the invention.

With reference to FIG. 3, the process of transmission of a desired microwave through the foregoing receiving apparatus will now be roughly described. A number of broadcast waves sent from broadcasting satellites (such as Satecom F-1, or 24 Transponder, Comstar D-2, Westar III, and the like) are reflected by the mirror 16 to enter the horn 17. The microwaves are then transformed from a waveguide mode into a coaxial mode by a mode converter 26 provided in the case 19. The transformed signals then enter a frequency converter 28 of a frequency-conversion device (as mentioned before) 27 as also provided in the case 19. In addition, a selection signal is sent from the station selector 21 into the convertion device 27 through the transmission line 20, and is allowed to enter the frequency converter 28 through a transmission line 29. Then, only the broadcast signal of the different ones from the converter 26 which corresponds to the selection signal is changed into a signal with the predetermined lower frequency by the frequency converter 28, and is sent therefrom through the line 20 into the station selector 21 and then into the telereceiver 22.

The selection signal is provided from the station selector 21 as follows: A selection-signal generator 30 is adapted to produce a signal for selecting the broadcast wave chosen by a selector switch 32 with the help of a reference signal with a given frequency produced by a reference-signal generator 31. Thus produced selection signal is transmitted to the frequency converter 28 through the line 20 as mentioned above.

Figure 4:
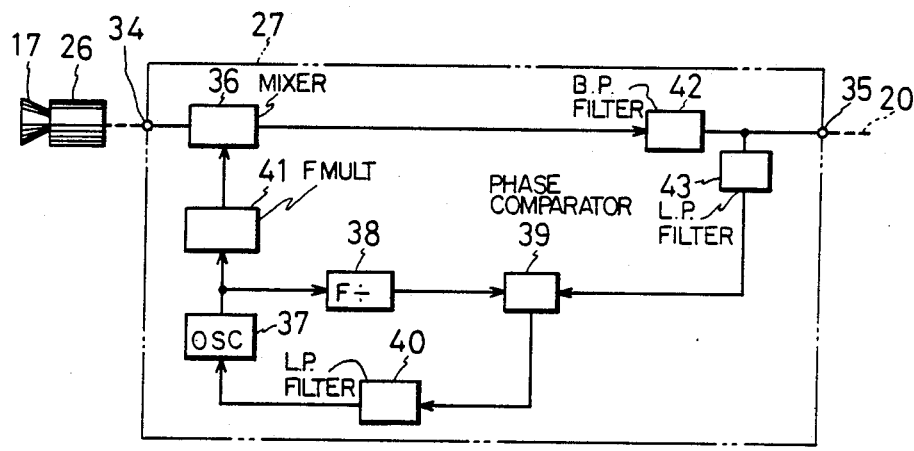
FIG. 4 is a detailed block diagram of a frequency-conversion means employed in the apparatus of FIG. 3.

Referring to FIG. 4, there are shown the details of the converter means 27. The converter means 27 is provided with an input terminal 34 and an output terminal 35. The frequency converter 28 includes a mixer 36, an oscillator 37, a frequency divider 38, a phase comparator 39, a low-pass filter 40, a frequency multiplier 41, and the like. In the particular embodiment herein the oscillator 37 comprises a VCO (voltage controlled oscillator) which is adapted to produce oscillations with particular frequencies depending upon the voltages of different input signals. The oscillatory signal from the oscillator 37 is changed into one of a reduced frequency by the frequency divider 38. This divider 38 comprises a pair of divider means which are adapted for the division into 1/256 and for that into ½, respectively. The frequency-divided signal is sent to an input terminal of the phase comparator 39 while a station-selector signal (selection signal) input from the output terminal 35 (of the converter means 27) and allowed to pass the low-pass filter 43 (the circuit corresponding to the transmission line 29 in FIG. 3) is simultaneously sent to another input terminal of the comparator 39. Then, the comparator 39 develops the signal as determined by the difference between the phases of the two signals. The signal developed in the comparator 39 is sent to the low-pass filter 40 so as to be converted into a DC signal. The DC signal is sent to the oscillator 37.

The above-mentioned process of transmission of the signals has the following purpose: If, for example, the oscillating frequency of the oscillator 37 is made higher than the predetermined one corresponding to the frequency of the station-selector signal due to a chance cause such as a variation in the ambient temperature, the frequency of the signal from the divider 38 to the comparator 39 is higher than that of the selector signal from the low-pass filter 43 to the comparator 39. Therefore the comparator 39 is adapted to develop the signal to make lower the oscillator frequency in such a case. The developed signal is sent to the oscillator 37 through the low-pass filter 40 so that the oscillating frequency starts to become smaller. The now frequency-reduced oscillation is again sent to the comparator 39 for the comparison with the selector signal, and if the frequency of the former (divided in the divider 38) is still higher than that of the latter, the comparator 39 further produces a frequency-lowering signal. And when this process has been repeated until the phase difference between the two incoming signals in the comparator 39 becomes zero, the comparator 39 no longer emits signals to reduce the oscillating frequency of the oscillator 37, but keeps emitting the signal which has reduced the oscillator frequency to such a level so that the oscillator 37 keeps emitting the signal of the predetermined frequency corresponding to that of the selector signal. Similarly, if the oscillator frequency is made lower than the predetermined one corresponding to the frequency of the selector signal, the comparator 39 functions to develop signals to increase the oscillator frequency until it becomes correspondent to the frequency of the selector signal.

The foregoing signal from the oscillator 37 whose frequency exactly corresponds to that of the selector signal is multiplied by the frequency multiplier 41 so that it becomes a frequency-conversion signal. This signal is then sent to the mixer 36 wherein the signal is mixed with a number of different broadcast wave signals sent from the input terminal 34 to the mixer 36. By this mixture broadcast signals of frequencies such as 3.7 to 4.2 GHz may be converted into signals of reduced frequencies, such as several tens of megahertz. Thus frequency-reduced signals are then allowed to enter a band-pass filter 42 for filtering out only one of all incoming signals which has a predetermined intermediate frequency (such as 80 MHz). Thus, only the broadcast signal corresponding to the station-selector signal is selected from among all broadcast wave signals coming from the input terminal 34, and the selected signal is output from the terminal 35 (under reduced frequencies). It is to be noted that no frequency multiplier such as 41 might be provided if the oscillator 37 were adapted directly to produce frequency-conversion signals.

Figure 5:
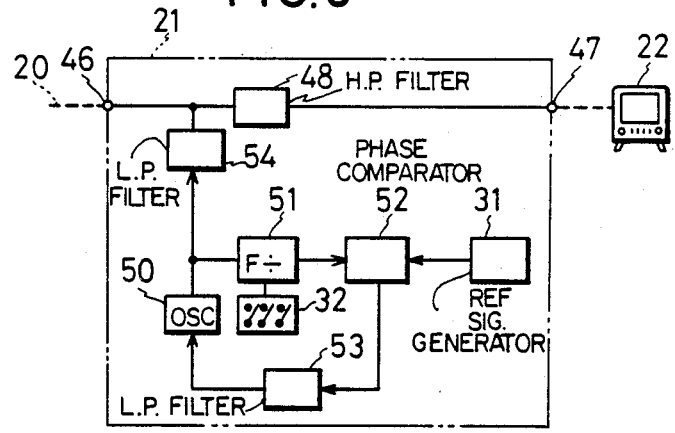
FIG. 5 is a detailed block diagram of a station selector employed in the apparatus of FIG. 3.

FIG. 5 illustrates the details of the station selector 21. The selector 21 includes an input terminal 46 and an output terminal 47. The foregoing signal (intermediate-frequency signal) output from the converter means 27 is sent to the input terminal 46, and enters a high-pass filter 48 which is adapted to pass the intermediate-frequency signals, but does not allow the selector signals to pass therethrough. The broadcast-wave signal is then sent to the output terminal 47, and to the telereceiver 22. The selection-signal generator 30 mentioned before includes an oscillator 50, a programmable frequency divider 51, a phase comparator 52, and a low-pass filter 53. As with the converter means 27, the oscillator 50 comprises a VCO. The programmable frequency divider 51 can be given different division ratios by operating the selector switch 32. The reference-signal generator 31 comprises a device adapted to produce signals of extremely accurate and stable frequencies, such as a crystal oscillator. In the station selector 21 having such a construction, the signal produced by the oscillator 50 is sent to the frequency divider 51, and then to the phase comparator 52. The phase comparator 52 has a function similar to the comparator 39 of the converter means 27; that is, the comparator 52 controls the oscillator 50 in such a manner that the oscillator 50 keeps emitting the signals which, when reaching the comparator 52 through the frequency divier 51, have no phase difference with the reference signal sent from the signal generator 31 to the comparator 52. The oscillating frequency of the oscillator 50 is set at the value as obtained by multiplying the frequency of the reference signal by the division ratio of the divider 51. It may be seen from FIG. 5 that the oscillating frequency can be varied by selecting a desired division ratio of the programmable frequency divider 51 (by operating the selector switch 32). The signal from the oscillator 50, as a station-selector signal, is sent to a low-pass filter 54 and to the input terminal 46, and supplied to the converter means 27 through the line 20.

The converter means 27 and the station selector 21 are operated as mentioned above. In short, a desired one of the various broadcast microwaves received by the antenna 15 can be picked up in the converter means 27 by operating the selector switch 32 while the desired signal is simultaneously reduced in its frequency, and the signal is sent to the indoor station selector 21 through the transmission line 20 and finally to the telereceiver 22.

The various frequencies used in the foregoing receiving apparatus may be those as shown in Table 1, for example:

TABLE 1

| Station Selector | | | | Frequency-Converter Means | | | |
|---|---|---|---|---|---|---|---|
| Reference signal (KHz) | Channel to be received | Division ratio of programmable divider 51 selected with selector switch 32 | Frequency of selector signal (MHz) | Oscillating frequency of oscillator 37 (MHz) | Frequency of frequency conversion signal (MHz) | Frequency of broadcast wave to be selected (MHz) | Frequency of signal sent from output terminal (MHz) |
| 15.625 | chan. 1 | 190 | 2.968750 | 760 | 3,800 | 3,720 | 80 |
| 15.625 | chan. 2 | 191 | 2.964375 | 764 | 3,820 | 3,820 | 80 |
| 15.625 | chan. 24 | 213 | 3.328125 | 852 | 4,260 | 4,180 | 80 |

Referring to FIGS. 6 to 9, it will be seen that a modified form of the invention is shown. In these Figs., the same components as in the preceding embodiment are designated by the same numerals, and the items similar to the preceding ones in function are designated by the same numerals plus 200.

Figure 6:
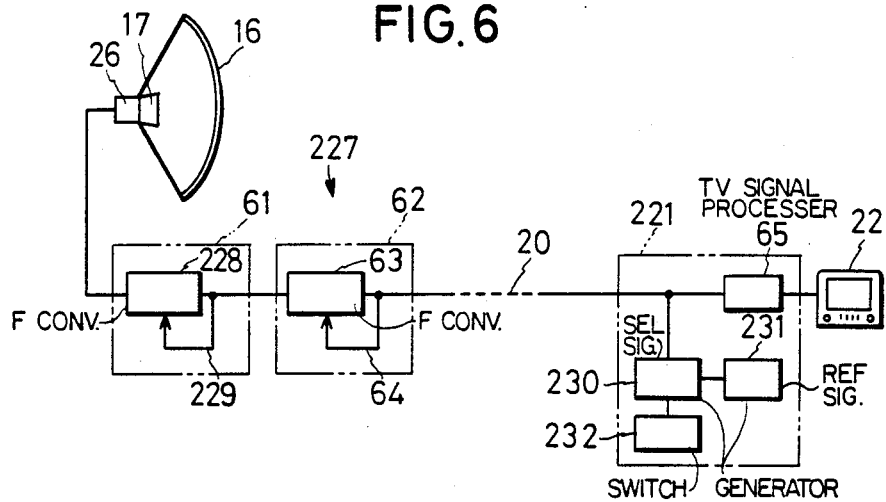
FIG. 6 is an outline of a receiving apparatus that is another embodiment of the invention.

Referring now to FIG. 6, a frequency-converter means 227 includes a first conversion section 61 housed in the casing 19 and a second conversion section 62 mounted to the back of the reflector 16. The two conversion sections are connected to each other by means of a coaxial cable. A signal put into the horn 17 is transformed into a coaxial mode by the transformer 26. The signal may be of a frequency within a range of 3.7 to 4.2 GHz. The frequency of the signal is reduced to a first intermediate frequency of 1.2 GHz by a frequency converter 228 provided in the first frequency-conversion section 61. Then, the reduced frequency of the signal is further lowered to a second intermediate frequency of 70 MHz by a second frequency-conversion signal which is emitted in a frequency converter 63 provided in the second frequency-conversion section 62. After such a two-step reduction in frequency, the signal is allowed to pass through the transmission line 20 and enter a station selector 221. In the selector 221 the signal is made, by a television signal processor 65, into a signal receivable by a usual television receiver. The signal is then supplied to the receiver 22. In this process the frequency-conversion signal in the second conversion section 62 is produced on the basis of a reference signal supplied from the television signal processor 65 to the frequency converter 63 through the transmission line 20 and a circuit 64 (provided in the second conversion section 62).

The foregoing two-step reduction of the signal frequency provides the following advantage: If a considerable number of broadcast waves of different channels (from broadcasting satellites) are simultaneously intercepted by the receiving antenna, it may not be possible for the receiving apparatus such as the preceding embodiment exactly to provide only the selected channel on the screen, but with such an apparatus a secondary or ghost image may appear additionally on the television screen since an undesired or unselected signal (i.e., the signal with the frequency corresponding to that of the signal to be selected in relation to the frequency-conversion signal and therefore having its frequency reduced to the same level as the selected signal) is very likely to reach the television receiver together with the selected signal. However, such a ghost-image producing signal is no longer allowed to come out from the second conversion section 62 into the transmission line 20 by reducing the frequency of the desired (selected) signal in the foregoing double manner, but only the selected signal may produce its pure image on the screen.

Figure 7:
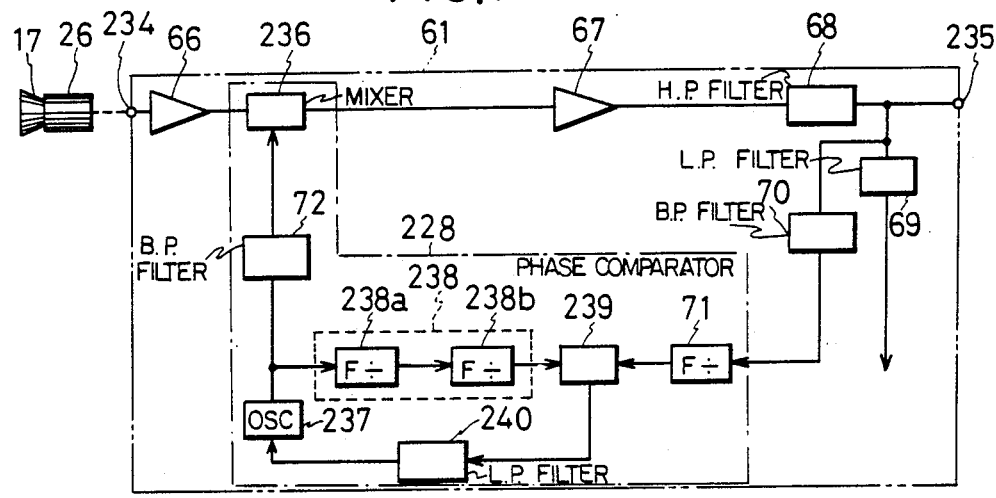
FIG. 7 is a block diagram of a first frequency-conversion means employed in the apparatus of FIG. 6.

Referring to FIG. 7, it will be seen that a detailed construction of the first frequency-conversion section 61 is shown. The conversion section 61 includes the previously mentioned frequency converter 228, a circuit 229, and other circuits. A signal supplied from the mode transformer 26 to an input terminal 234 is amplified by a high-frequency amplifier 66 of a low-noise type, i.e., with a noise factor of one decibel or so. In a mixer 236 the amplified signal is then mixed with a first frequency-conversion signal so as to have its frequency lowered to the previously-mentioned first intermediate frequency of 1.2 GHz. Thus frequency-lowered signal is then amplified by another high-frequency amplifier 67 which is adapted for the exclusive amplification of only 1.2 GHz signals from the mixer 236 with a bandwidth of ±15 MHz. Thus amplified signal passes a high-pass filter 68 and leaves the conversion section 61 from an output terminal 235. On the other hand, a selector signal (from the station selector 221) supplied to the output terminal 235 is allowed to enter a band-pass filter 70 and a frequency dividor 71. At the divider 71 the signal frequency may be divided with a ratio of ½, for example. The now frequency-divided signal is then supplied to a phase comparator 239. An oscillator 237 emits a signal with a fundamental frequency of 984 to 1,076 MHz as well as that with a frequency of 4,920 to 5,380 MHz (as a higher harmonic wave), in accordance with the voltage of signals input thereto. Of these signals only the fundamental wave signal has its frequency divided with a ration of 1/256 by a frequency divider 238a and then with a ratio of ½ by another frequency divider 238b. Thus frequency-reduced signal is sent to the phase comparator 239. The output signal from the phase comparator 239 is passed through a low-pass filter 240 and supplied to the oscillator 237. As with the first embodiment, the oscillator 237 is thus enabled to emit a signal of the predetermined frequency corresponding to that of the selector signal. The higher harmonic wave signal from the oscillator 237 is allowed to pass through a band-pass filter 72 for filtering out the frequency range of 4,920 to 5,380 MHz. The filtered signal is sent to the mixer 236 for the mixture thereof with the broadcast signal as the previously-mentioned first frequency conversion signal.

In addition to the above-mentioned selector signal, a DC signal (e.g., of 12 volts) is supplied to the input terminal 35. This signal is passed through a low-pass filter 69 and sent to the various circuits of the conversion section 61 so as to operate these circuits.

Figure 8:
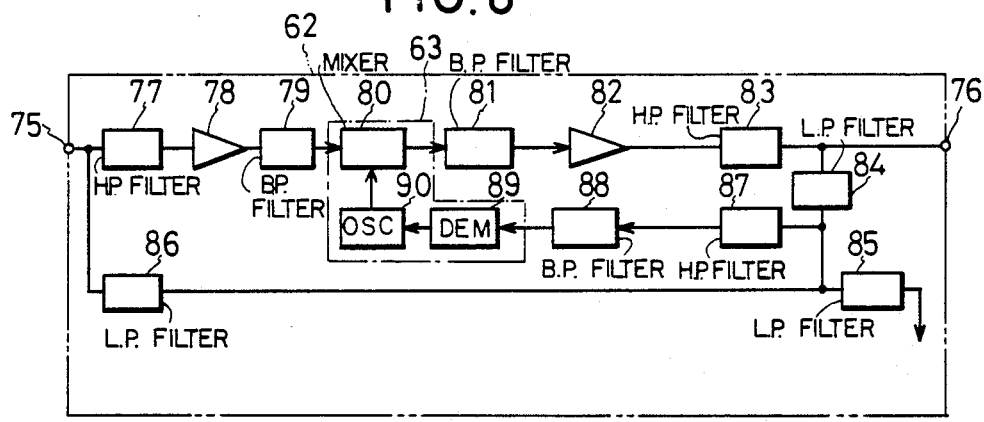
FIG. 8 is a block diagram of a second frequency-conversion means employed in the apparatus of FIG. 6.

Referring to FIG. 8, it will be seen that a detailed construction of the second frequency-conversion section 62 is shown. The second conversion section 62 includes the previously-mentioned frequency converter 63, a circuit 64, and other circuits. The signal of 1.2 GHz supplied to an input terminal 75 from the first conversion section 61 is allowed to pass a high-pass filter 77 and enter a high-frequency amplifier 78 adapted to lower the noise factor of the signal. The amplified signal is then passed through a band-pass filter 79 of a pass band of 1.2 GHz±25 MHz which is adapted to give the signal a desired image ratio. The output signal from the filter 79 is supplied to a mixer 80 whereby the signal is mixed with a second frequency-conversion signal of 1.27 GHz (described hereafter) so that the frequency of the former signal is lowered to the previously-mentioned second intermediate frequency of 70 MHz. Thus frequency-reduced signal is then allowed to pass another band-pass filter 81 and enter a high-frequency amplifier 82 adapted further to reduce the noise factor of the signal. The amplifier 82 has a center frequency of 70 MHz and a passband width of ±15 MHz. The amplified signal of 70 MHz from the amplifier 82 passes a high-pass filter 83 and leaves the conversion section 62 from an output terminal 76 so as to pass through the transmission line 20.

On the other hand, a selector signal is supplied to the output terminal 76 through the line 20, and is allowed to pass a low-pass filter 84 and another low-pass filter 86. This signal is then output from the input terminal 75 to the first conversion section 61 (which signal is the selector signal described previously as being supplied to the output terminal 235 of the section 61). In addition, a DC signal is supplied to the output terminal 76 with a portion thereof sent to the section 61 through the same circuits as the selector signal and its other portion allowed to pass the low-pass filter 84 and another low-pass filter 85 so as to be sent to the various circuits of the section 62 for operating them.

Furthermore, the output terminal 76 is supplied with a still another signal, namely, a reference signal of 10.7 MHz for producing the previously-mentioned second frequency-conversion signal. The reference signal is allowed to pass a low-pass filter 84, a high-pass filter 87, and a band-pass filter 88 and enter a demodulator 89. The band-pass filter 88 may comprise a ceramic filter, for example. At the section 89 the signal is demodulated, and its DC component is output to an oscillator 90. The oscillator 90 is adapted to change its oscillating frequency in accordance with the voltage of the DC signal from the demodulator 89 and produce a signal of 1.27 GHz when a voltage of predetermined magnitude is applied thereto from the demodulator 89. The signal of 1.27 GHz is then sent to the mixer 80 as the second frequency-conversion signal, so that the signal is mixed with another input signal from 79 to 80 so as to reduce the frequency of the latter signal.

Figure 9:
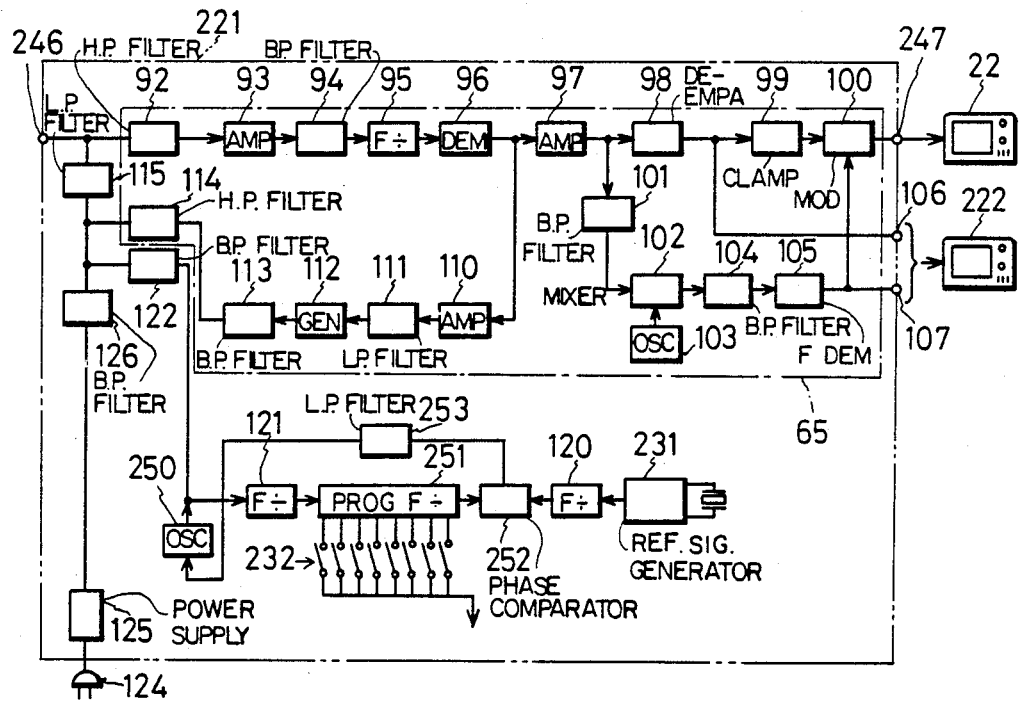
FIG. 9 is a block diagram of a station selector employed in the apparatus of FIG. 6.

Referring to FIG. 9, it will be seen that a detailed construction of the station selector 221 is shown. The station selector 221 includes the previously-mentioned signal processor 65, signal generators 230 and 231, and other circuits. The signal of the previously-mentioned second intermediate frequency (70 MHz) from the second conversion section 62 is supplied to an input terminal 246 (through the line 20), and passes a high-pass filter 92 to enter a means 93 for amplifying second-intermediate-frequency signals of 70 MHz±15 MHz. The amplified signal is then passed through a band-pass filter 94 and enters a frequency divider 95 whereby the signal frequency is divided with a ratio of ½, so that a signal of 35 MHz is produced. The now frequency-reduced signal is then FM demodulated by a demodulator 96 in such a manner that the signal has frequency components ranging from DC to 8 MHz. The audio signal and video signal of the output signal from the demodulator 96 are amplified by an amplifier 97, and only the amplified video signal then passes a de-emphasis circuit 98 and a clamping circuit 99. The clamping circuit 99 is adapted to adjust the signal level without changing its waveform so that the causes of flicker and hum effects are removed from the signal, thereby making the signal a highly-excellent video signal. The excellent video signal is then sent to a modulator 100. The abovementioned audio signal amplified at 97 is allowed to pass a band-pass filter 101 adapted for the frequency range of 5 to 8 MHz so as to produce a number of signals or audio subcarriers. The audio subcarriers are allowed to enter a mixer 102. Simultaneously the mixer 102 is supplied with a signal from a local oscillator 103 for converting one of the subcarriers of 5 to 8 MHz from the filter 101 into a signal of 10.7 MHz. The local oscillator 103 is adapted to allow its oscillating frequency to be varied, by manual operation, within the range between 15.7 MHz and 18.7 MHz. Therefore, a desired signal can be selected, for frequency conversion, from among the audio subcarriers by setting the oscillator frequency as desired within the foregoing range. Thus selected signal with an increased frequency of 10.7 MHz is output from the mixer 102 to pass a band-pass filter 104, such as a ceramic filter, and enter a demodulator 105, such as a FM demodulator. The demodulator 105 is adapted to make an audio signal of lower frequency from the 10.7 MHz signal. The output signal from the demodulator 105 is sent to the previously-mentioned modulator 100. By the demodulator 100. the video signal of 0 to 4.2 MHz from the clamping circuit 99 is amplitude-modulated while the audio signal from the demodulator 105 is frequency-modulated. In addition, thereupon, the modulator 100 combines the two signals to produce a signal receivable by a NTSC color television receiver. The signal thus produced is supplied from an output terminal 247 to the telereceiver 22. Addtionally, both video and audio signals as described above are also sent to output terminals 106 and 107, respectively. Therefore, the same channel can be additionally received by connecting another television receiver 222 to the output terminals 106 and 107.

A portion of the previously-mentioned output signal from the demodulator 96 is supplied to a DC amplifier 110. The amplified signal enters a low-pass filter 111 for filtering out only the DC component thereof. The filtered DC signal is supplied to a signal generator 112, such as a VCO (voltage controlled oscillator), for producing the previously-mentioned reference signal of 10.7 MHz to be used for generating the second frequency-conversion signal in the second conversion section 62. The signal generator 112 is adapted to adjust the frequency of the reference signal, when producing it, within a range of ±200 KHz in accordance with the voltage of the signal from the low-pass filter 111. The reference signal from the generator 112 is passed through a band-pass filter 113 adapted for the frequency of 10.7 MHz, and further through a high-pass filter 114 and a low-pass filter 115. The signal is then output from the input terminal 246 to pass through the transmission line 20.

The demodulator 89 and oscillator 90 (of the second conversion section 62) and the demodulator 96 and signal generator 112 (of the station selector 221) have the following operational relationship: If the oscillating frequency of the oscillator 90 is made higher than the predetermined one, i.e. 1.27 GHz, due to a variation of the ambient temperature (such as by the exposure of the section 62 to direct rays of the sun), then the broadcast signal as reduced again in its frequency at the mixer 80 may not have the exact reduced frequency, namely, the predetermined second intermediate frequency of 70 MHz, but its frequency is made higher than that. In such a case, the voltage of the DC component of the signal demodulated at the demodulator 96 is made higher accordingly. Thus increased voltage is applied to the signal generator 112, resulting in a reference signal of increased frequency being produced from the signal generator 112. The increased freqency of the reference signal causes the demodulator 89 to emit a signal of reduced voltage. The reduced output voltage of the demodulator 89 allows the oscillator 90 to reduce its oscillating frequency, so that the oscillator frequency may be finally reduced to 1.27 GHz to re-provide the exact second intermediate frequency of 70 MHz. Also, if the oscillator frequency is made lower than 1.27 GHz due to, e.g. the exposure of the conversion section 62 to rain, then the foregoing items are operated in the manner opposite to the preceding one so as to increase the oscillator frequency to the predetermined one. Thus, if the frequency of the signal from the oscillator 90, or the second frequency-conversion signal, happens to deviate from 1.27 GHz, it is instantly corrected to exactly keep the second intermediate frequency of the broadcast signal at 70 MHz. Consequently it is possible to keep receiving the audio and video signals of the desired channel in their continued flawless conditions as practically unaffected by the outdoor temperature, so that the completely satisfactory picture and sound may be received in a continued stable manner by the television receiver.

Referring again to FIG. 9, a description will now be made of the production of the selector signal. In addition to the previously-mentioned reference signal generator 112 (for the second frequency-conversion signal), another reference-signal generator 231 (for the selector signal) is provided in the station selector 221. The signal generator 231 is adapted continually to produce signals of a given frequency, such as 4 MHz. The reference signal is supplied to a frequency divider 120 for the division of the frequency of the reference signal with a ratio of 1/2048. The frequency-divided signal is sent to a phase comparator 252. A signal produced from an oscillator 250 has its frequency divided with a ratio of ½ by another frequency divider 121, and this signal is further supplied to a programmable frequency divider 251 in which the division ratio can be set at a desired one within a range from 1/246 to 1/269 by operating a selector switch 232. The output signal from the divider 251 is sent to the phase comparator 252 which compares the phase difference between the signals from divider 120 and from the divider 251 so as to have the oscillator 250 emit the selector signal of the frequency exactly corresponding to that of the broadcast wave selected by the switch 232. The selector signal thus produced is passed through a band-pass filter 122 and a low-pass filter 115, and enters the transmission line 20 from the input terminal 246.

The receiving apparatus hereof is supplied with power as follows: The station selector 221 is plugged in, at 124, to an electric outlet as provided in a house or building, so that commercially available power is supplied thereto. The power is converted into a DC power of a given low voltage, such as 12 V, by a power circuit 125. The direct current is supplied to the preceding various circuits of the selector 221 to operate them while it simultaneously passes the low-pass filters 126 and 115 and the input terminal 246 for the supply to the other devices through the line 20.

In short, the foregoing second embodiment hereof is operated as follows: The selector switch 232 is manually operated to pick up any and only desired one of the broadcast microwaves intercepted by the antenna 15 while simultaneously reducing the frequency of the desired signal in a two-step manner by the first and second converter means 61 and 62, and introduce the selected signal into the indoor station selector 221, through the line 20, to make it into a signal receivable by the receiver 22.

The various frequencies used in the foregoing second embodiment may be those as shown in Table 2, for example:

TABLE 2

| | Station Selector | | | First Frequency-Conversion Section | | | |
|---|---|---|---|---|---|---|---|
| Reference signal (MHz) | Channel to be received | Division ratio of programmable divider 251 selected with selector switch 232 | Frequency of selector signal (MHz) | Oscillating frequency of oscillator 237 (MHz) | Frequency of first frequency-conversion signal (MHz) | Frequency of broadcast wave to be selected (MHz) | Frequency of signal sent from output terminal (MHz) |
| 4 | chan. 1 | 246 | 3.843750 | 984 (4,920) | 4,920 | 3,720 | 1,200 |
| 4 | chan. 3 | 248 | 3.875000 | 992 (4,960) | 4,960 | 3,760 | 1,200 |
| 4 | chan. 24 | 269 | 4.203125 | 1,076 (5,380) | 5,380 | 4,180 | 1,200 |

Figure 10:
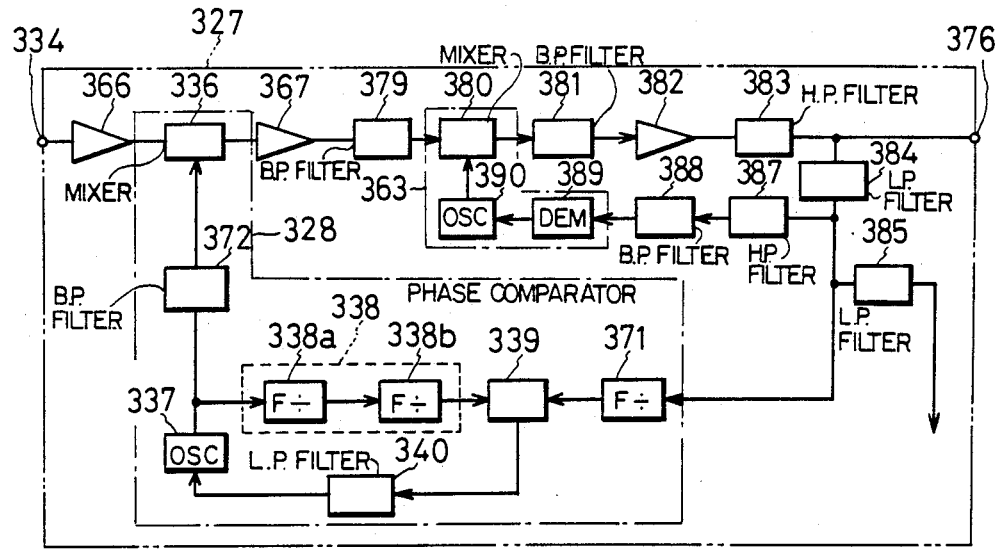
FIG. 10 is a block diagram which shows a modified form of the frequency-conversion means employed in the apparatus of FIG. 6.

Referring to FIG. 10, the various circuits as employed in the foregoing first and second frequency-conversion sections 61 and 62 may be located in one and the same casing, such as 19 of FIGS. 1 and 2, instead of being disposed in the entirely-different positions as mentioned before. The circuits of FIG. 10 having the same functions as those of FIGS. 7 and 8 are designated by a number of two figures of each preceding numeral plus 300.

As many apparently widely different embodiments of this invention may be made without departing from the spirit and scope thereof, it is to be understood that the invention is not limited to the specific embodiments thereof except as defined in the appended claims.

What is claimed is:

1. An apparatus for receiving sattelite broadcasts comprising
   a station selector for indoor use which is provided with an input terminal for connection thereto to one end of a transmission line and an output terminal for connection thereto of a television receiver and is adapted to deliver a selected intermediate-frequency signal, which is delivered to said input terminal thereof from said one end of the transmission line, to said television receiver, and
   a frequency-conversion device for outdoor use which is provided with an input terminal for connection thereto to a receiving antenna and an output terminal for connection thereto to the other end of said transmission line and is adapted to transform selected one of those broadcast signals in multiple channels which are supplied to said input terminal thereof by said antenna into said selected intermediate-frequency signal and to deliver the same to said transmission line from said output terminal thereof,
   said station selector including:
   (a) a reference-signal generator for production of a frequency-stabilized reference signal;
   (b) a selection-signal generator adapted to receive said reference signal, to form a station-selecting signal of a frequency equal to a multiple of the frequency of said reference signal and further to deliver said station-selecting signal to said transmission line from said input terminal of said station selector; and
   (c) a selector switch operably connected to said selection-signal generator for choosing said multiple; and said frequency-conversion device including:
   (d) a first oscillator for generating a frequency-conversion signal of a frequency controlled by an input thereto;
   (e) a frequency divider adapted to receive said frequency-conversion signal and to produce a signal of a frequency equal to a submultiple of the frequency of said frequency-conversion signal;
   (f) a first phase comparator adapted to compare the phase of a first input thereof supplied by said frequency divider with the phase of said station-selecting signal applied as a second input thereof, to produce a control output dependent on the difference between the input phases of said first phase comparator and further to apply said control output as said input of said first oscillator;
   (g) a mixer adapted to mix the broadcast signals in multiple channels delivered by said antenna as a first input thereof through said input terminal of said frequency-conversion device with said frequency-conversion signal supplied by said first oscillator as a second input thereof, thereby producing intermediate-frequency signals; and
   (h) a band-pass filter adapted to pass only one of said intermediate-frequency signals that has a prescribed intermediate frequency and to deliver said one intermediate-frequency signal as said selected intermediate-frequency signal; and
   (i) said control output of said first phase comparator controlling the output frequency of said first oscillator so that any difference between said submultiple of said output frequency of said first oscillator and said station-selecting signal is compensated for.

2. An apparatus for receiving sattelite broadcasts as set forth in claim 1 wherein said selection-signal generator in said station selector includes:
 (a) a second oscillator for generating said station-selecting signal of a frequency controlled by an input thereto and adapted to supply said input terminal of said station selector with said station-selecting signal;
 (b) a programmable frequency divider which is so constructed as to provide a submultiple of the output frequency of said second oscillator on demand from said selector switch and to produce a signal of a frequency equal to said submultiple of the frequency of said station-selecting signal; and
 (c) a second phase comparator adapted to compare the phase of a first input thereof supplied by said programmable frequency divider in said station selector with the phase of said reference signal applied to a second input thereof, to produce a control output dependent on the difference between the input phases of said second phase comparator and further to apply said control output of said second phase comparator as said input of said second oscillator; and
 (d) the control output of said second comparator controlling the output frequency of said second oscillator so that any difference between said submultiple of said output frequency of said second oscillator and said reference signal is compensated for.

3. An apparatus for receiving sattelite broadcasts comprising a station selector for indoor use which is provided with an input terminal for connection thereto to one end of a transmission line and an output terminal for connection thereto to a television receiver, and is adapted to process a second selected intermediate-frequency signal which is supplied to said input terminal thereof from said one end of the transmission line and to deliver the processed signal to said television receiver, and
 a frequency-conversion device for outdoor use which is provided with an input terminal for connection thereto to a receiving antenna, an output terminal for connection thereto to the other end of said transmission line, said frequency conversion device comprising a first conversion section and a second conversion section and is adapted to transform selected one of those broadcast signals in multiple channels which are supplied to said input terminal thereof by said antenna into a first selected intermediate-frequency signal, to transform the first selected intermediate frequency signal into said second selected intermediate-frequency signal and to deliver said second selected intermediate-frequency signal to said transmission line from said output terminal thereof,
 said station selector including:
 (a) a reference-signal generator for production of a frequency-stabilized first reference signal;
 (b) a selection-signal generator adapted to receive said first reference signal, to form a station-selecting signal of a frequency equal to a multiple of the frequency of said first reference signal and further to deliver said station-selecting signal to said transmission line from said input terminal of said station selector;
 (c) a selector switch operably connected to said selection-signal generator for choosing said multiple, and
 (d) a television signal processor adapted to generate a second reference signal whose output frequency is controlled in accordance with the variation of the frequency of said second selected intermediate frequency so that said variation is compensated for; and
 said first conversion section including:
 (e) a first oscillator for generating a first frequency-conversion signal of a frequency controlled by an input thereto;
 (f) a frequency divider adapted to receive said first frequency-conversion signal and to produce a signal of a frequency equal to a submultiple of the frequency of said first frequency-conversion signal;
 (g) a first phase comparator adapted to compare the phase of a first input thereof supplied by said frequency divider with the phase of said station-selecting signal applied as a second input thereof, to produce a control output dependent on the difference between the input phases of said first phase comparator and further to apply said control output of said first phase comparator as said input of said first oscillator;
 (h) a first mixer adapted to mix broadcast signals in multiple channels delivered by said antenna as a first input thereof through said input terminal of said frequency-conversion device with said first frequency-conversion signal supplied by said first oscillator as a second input thereof, thereby producing first intermediate-frequency signals; and
 (i) a narrow-band amplifier adapted to amplify only selected one of said first intermediate-frequency signals that has a first prescribed intermediate frequency; and
 (j) said control output of said first phase comparator controlling the output frequency of said first oscillator so that any difference between said submultiple of said output frequency of said first oscillator and said station-selecting signal is compensated for;
 said second conversion section including:
 (k) a second oscillator for generating a second frequency-conversion signal whose frequency is controlled by said second reference signal transmitted from said input terminal of said station selector; and
 (l) a second mixer adapted to mix said first selected intermediate-frequency signal delivered by said first conversion section as a first input thereof with said second frequency-conversion signal supplied by said second oscillator as a second input thereof, thereby producing said second selected intermediate-frequency signal.

4. An apparatus for receiving sattelite broadcasts as set forth in claim 3 wherein said selection-signal generator in said station selector includes:
 (a) a third oscillator for generating said station-selecting signal of a frequency controlled by an input thereto and adapted to supply said output terminal of said station selector with said station-selecting signal;
 (b) a programmable frequency divider which is so constructed as to provide a submultiple of the output frequency of said third oscillator on demand from said selector switch and to produce a signal of a frequency equal to said submultiple of the frequency of said station-selecting signal; and (c) a second phase comparator adapted to compare the phase of a first input thereto supplied by said programmable frequency divider in said station selector with the phase of said first reference signal applied to a second input thereof, to produce a control output dependent on the difference between the input phases of said second phase comparator and further to apply said control output of said second phase comparator as said input of said third oscillator; and (d) the control output of said second phase comparator controlling the output frequency of said third oscillator so that any difference between said submultiple of said output frequency of said third oscillator and the frequency of said first reference signal is compensated for.

5. An apparatus for receiving sattelite broadcasts as set forth in claim 4 wherein said television signal processor includes:

(a) a first demodulator adapted to frequency-demodulate said selected second intermediate-frequency signal delivered thereto through said transmission line and to produce a control output dependent on the difference between the frequency of said second selected intermediate-frequency signal and a second prescribed intermediate frequency; and (b) a signal generator adapted to receive said control output of said first demodulator as an input thereof and to produce said second reference signal whose frequency is controlled by said input thereof so that the variation of the output frequency of said signal generator is compensated for; and said second conversion section includes:

(c) a second demodulator adapted to receive said second reference signal delivered thereto through said transmission line and to apply a control output thereof dependent on the frequency of said second reference signal to said input of said second oscillator; and (d) the output frequency of said second oscillator is controlled by said control output of said second demodulator so that the variation of the output frequency of said second oscillator is compensated for.

* * * * *